US 12,062,483 B2

(12) United States Patent
Karasawa et al.

(10) Patent No.: US 12,062,483 B2
(45) Date of Patent: Aug. 13, 2024

(54) CURRENT SENSOR

(71) Applicant: HIOKI E.E. CORPORATION, Ueda (JP)

(72) Inventors: Yuki Karasawa, Ueda (JP); Koki Nakazawa, Ueda (JP); Kenta Ikeda, Ueda (JP); Kimihiko Yamagishi, Ueda (JP)

(73) Assignee: HIOKI E.E. CORPORATION, Ueda (JP)

( * ) Notice: Subject to any disclaimer, the term of this patent is extended or adjusted under 35 U.S.C. 154(b) by 141 days.

(21) Appl. No.: 17/806,155

(22) Filed: Jun. 9, 2022

(65) Prior Publication Data

US 2022/0399159 A1 Dec. 15, 2022

(30) Foreign Application Priority Data

Jun. 10, 2021 (JP) ................................. 2021-097432

(51) Int. Cl.
*H01F 27/30* (2006.01)
*G01R 15/18* (2006.01)
*H01F 27/24* (2006.01)

(52) U.S. Cl.
CPC ......... *H01F 27/306* (2013.01); *G01R 15/185* (2013.01); *H01F 27/24* (2013.01)

(58) Field of Classification Search
CPC .. H01F 27/306; H01F 27/24; H01F 2038/305; H01F 38/30; G01R 15/185; G01R 19/0092
See application file for complete search history.

(56) References Cited

U.S. PATENT DOCUMENTS

| | | | | |
|---|---|---|---|---|
| 9,341,657 B2* | 5/2016 | Klein | ..................... | G01R 33/04 |
| 9,448,262 B2* | 9/2016 | Hachida | ................. | G01R 33/02 |
| 2008/0122430 A1* | 5/2008 | Marcussen | ........... | G01R 15/185 |
| | | | | 324/119 |
| 2010/0118449 A1* | 5/2010 | Jackson | ............... | G01R 15/185 |
| | | | | 323/357 |
| 2015/0233977 A1* | 8/2015 | Platise | ................... | G01R 19/20 |
| | | | | 324/117 R |

FOREIGN PATENT DOCUMENTS

| | | |
|---|---|---|
| JP | 2008519269 A | 6/2008 |
| JP | 2012-83241 A | 4/2012 |
| JP | 2014215103 A | 11/2014 |

* cited by examiner

*Primary Examiner* — Akm Zakaria
(74) *Attorney, Agent, or Firm* — Jordan IP Law, LLC (57) ABSTRACT

A current sensor includes an excitation detection winding configured such that an excitation signal for exciting a second magnetic core is input, the excitation detection winding detects magnetic flux flowing through the second magnetic core and outputs a detection signal indicating a measurement-target current. The current sensor includes an auxiliary winding that detects the magnetic flux and outputs an auxiliary signal indicating the measurement-target current. The current sensor includes a feedback winding wound around first and second magnetic cores, the feedback winding being configured such that a signal generated from the detection signal is input, and the feedback winding being wound to cancel out magnetic flux of the first and second magnetic cores. The current sensor includes a circuit to output an output signal indicating a level of the measurement-target current by modifying a signal output from the feedback winding based on a correction signal generated from the auxiliary signal.

9 Claims, 7 Drawing Sheets

CURRENT SENSOR

CROSS-REFERENCE TO RELATED APPLICATION

The present application claims priority 35 U.S.C. § 119 to Japanese Patent Publication No. JP 2021-097432 (filed on Jun. 10, 2021) which is hereby incorporated by reference in its entirety.

TECHNICAL FIELD

The present invention relates to a current sensor.

BACKGROUND ART

JP2008-519269A discloses a current sensor in which an auxiliary current transformer is provided on the inner side of a core of a main current transformer.

The core of the main current transformer is wound with an AC pickup winding and a compensating winding.

SUMMARY OF INVENTION

In this current sensor, if the AC pickup winding and the compensating winding are wound around the same core, because the windings are in close distance from each other, there is a problem in that a capacitive coupling is caused between the AC pickup winding and the compensating winding in a high frequency band and a frequency band is limited.

An object of this disclosure is to provide a current sensor with a wide frequency band.

The current sensor of the present disclosure is provided with: a first magnetic core configured to surround a measurement-target object through which measurement-target current flows; a second magnetic core arranged next to the first magnetic core; an excitation detection winding wound around the second magnetic core, the excitation detection winding being configured such that an excitation signal for exciting the second magnetic core is input, and the excitation detection winding being configured to detect magnetic flux flowing through the second magnetic core and to output a detection signal indicating the measurement-target current; an auxiliary winding wound around the second magnetic core, the auxiliary winding being configured to detect the magnetic flux flowing through the second magnetic core and to output an auxiliary signal indicating the measurement-target current; a feedback winding wound around the first magnetic core and the second magnetic core, the feedback winding being configured such that a signal generated from the detection signal is input, the feedback winding being wound so as to cancel out magnetic flux of the first magnetic core; and a circuit configured to output an output signal indicating a level of the measurement-target current by modifying a signal output from the feedback winding based on a correction signal generated from the auxiliary signal, the signal from the feedback winding being output in accordance with the measurement-target current.

In the current sensor of the present disclosure, the feedback winding (corresponding to the compensating winding) that detects the signal corresponding to the measurement-target current is wound around the first magnetic core and the second magnetic core. In addition, the auxiliary winding (corresponding to the AC pickup winding) that detects the auxiliary signal used for modifying the output from the feedback winding is wound around the second magnetic core.

Thus, with the current sensor of the present disclosure, compared with a case in which the feedback winding and the auxiliary winding are wound around the same core, it is possible to make a capacitive coupling caused between the feedback winding and the auxiliary winding in a high frequency band small. With such a configuration, the limitation on the frequency band is suppressed.

Therefore, it is possible to provide the current sensor with the wide frequency band.

DESCRIPTION OF EMBODIMENTS

First Embodiment

Figure 1:
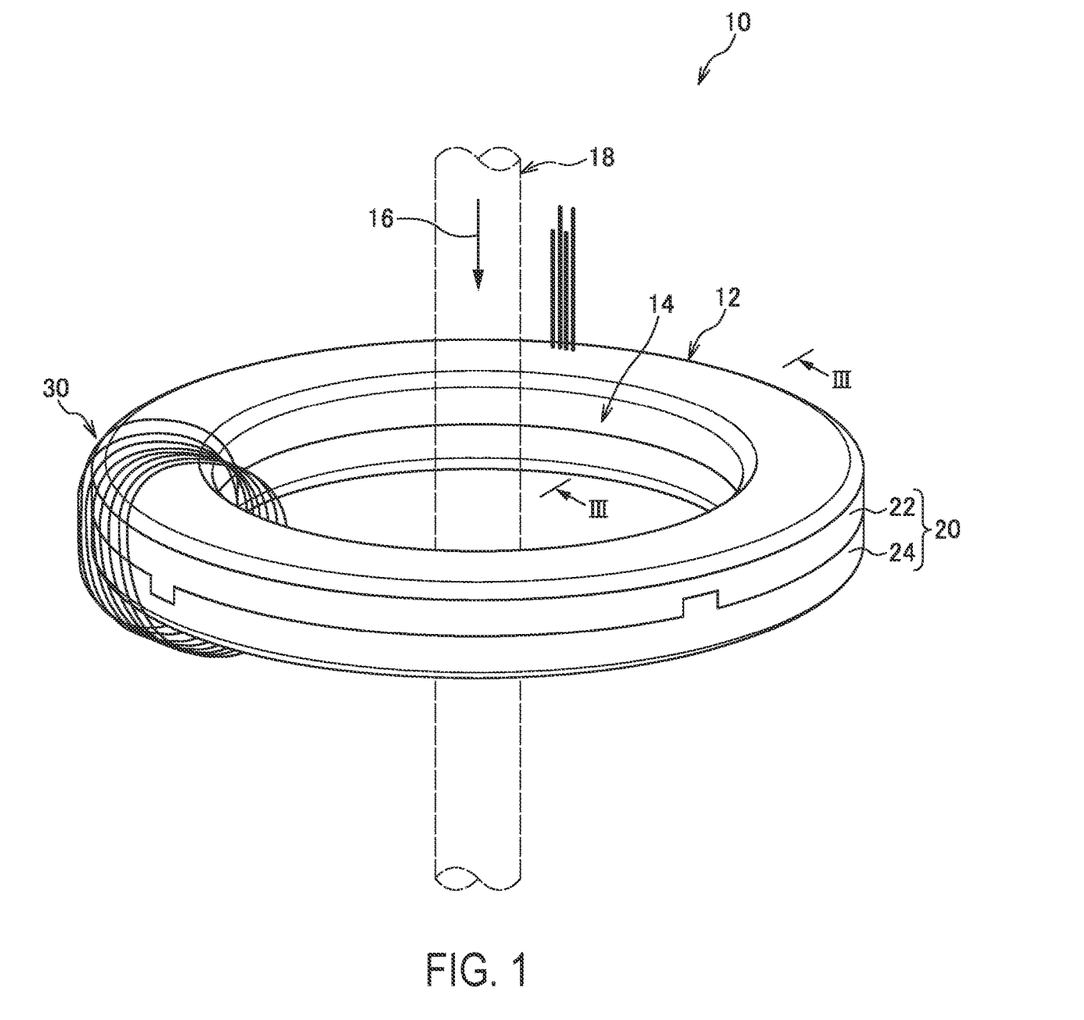
FIG. 1 is a perspective view showing a current sensor according to a first embodiment.
Figure 2:
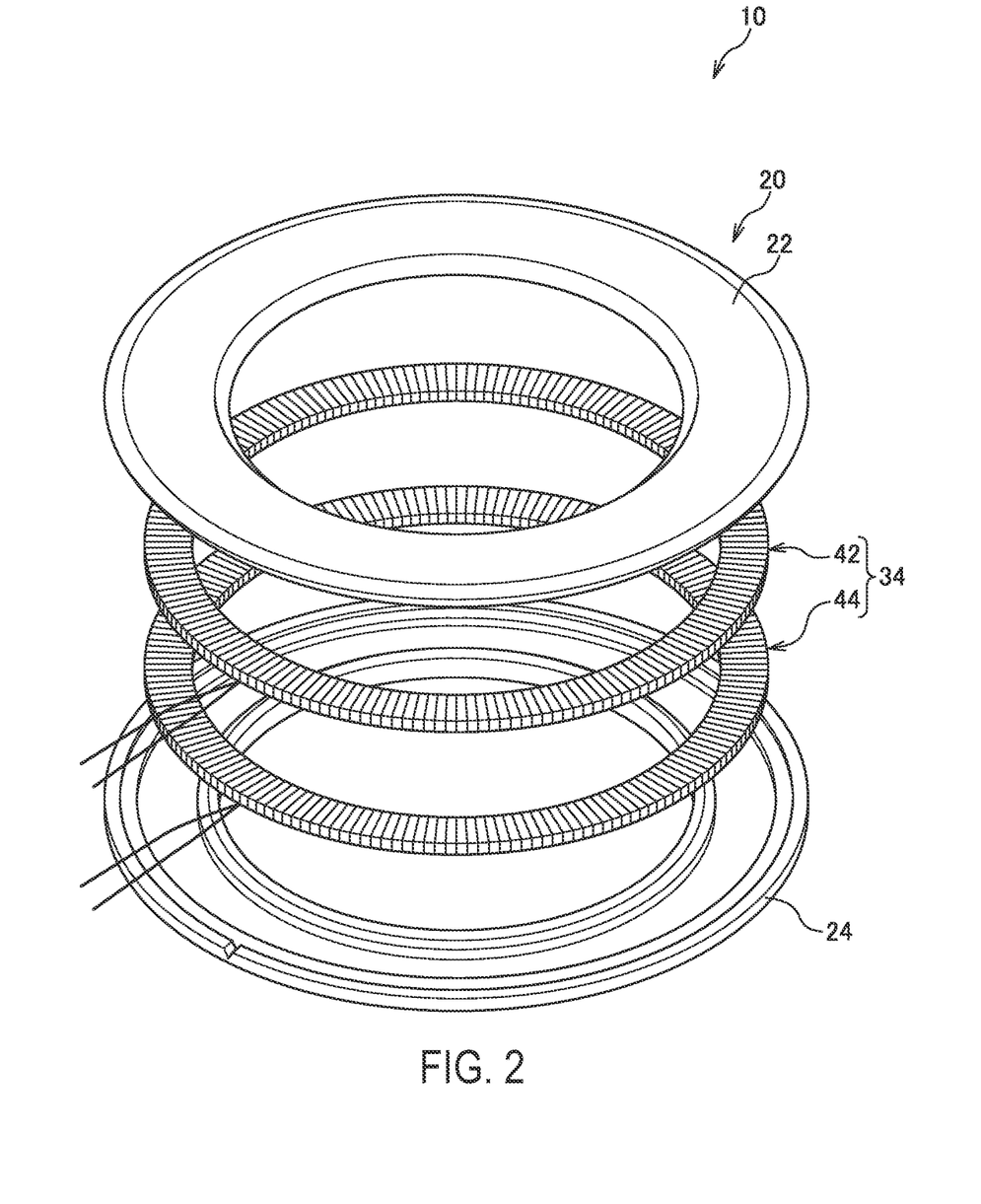
FIG. 2 is a diagram showing the inside of the current sensor according to the first embodiment, and is an exploded perspective view showing a state in which a first magnetic core is omitted.
Figure 3:
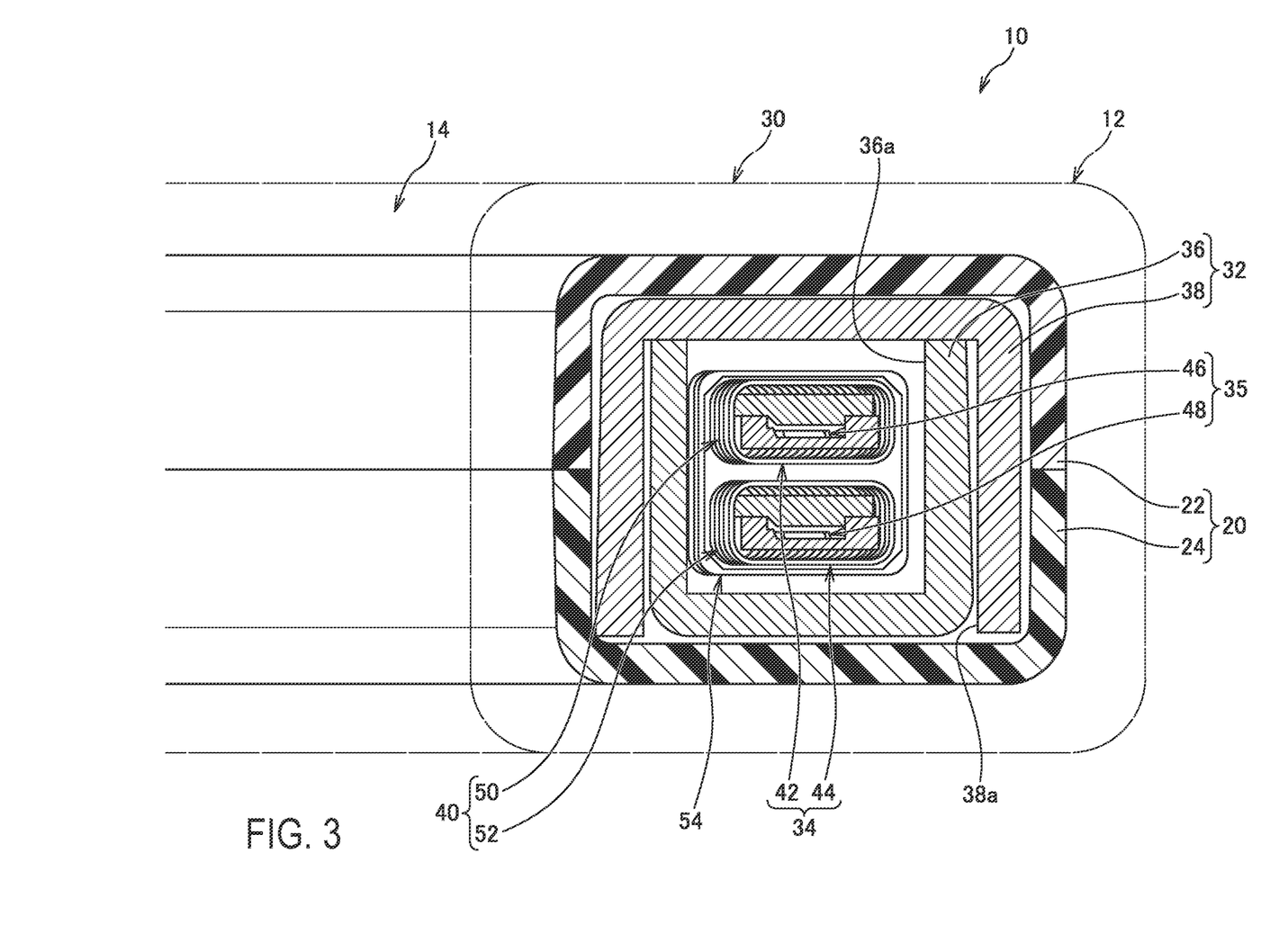
FIG. 3 is a sectional view taken along III-III in FIG. 1.

In the following, a current sensor 10 according to a first embodiment will be described with reference to the drawings. FIG. 1 is a perspective view showing the current sensor 10 according to the first embodiment. FIG. 2 a diagram showing the inside of the current sensor 10 according to the first embodiment and is an exploded perspective view showing a state in which a first magnetic core 32 is omitted. FIG. 3 is a sectional view taken along III-III in FIG. 1.

As shown in FIG. 1, a sensor main body 12 of the current sensor 10 is formed to have a circular ring shape. At the center part of the sensor main body 12, a circular insertion portion 14 is formed. The sensor main body 12 is arranged so as to surround a measurement-target object 18 through which measurement-target current 16 flows, and for the measurement-target object 18 that is inserted through the insertion portion 14, the sensor main body 12 measures the measurement-target current 16 flowing in the direction in which the measurement-target object 18 penetrates through the insertion portion 14.

The measurement-target object 18 is formed to contain a conductor through which the measurement-target current 16 flows. The measurement-target object 18 includes a bus bar with an exposed conductor or an electric wire formed of a conducing wire covered with a covering, and in this embodiment, as an example, the measurement-target object 18 is formed of the electric wire.

The current sensor 10 is a penetration-type current sensor for measuring a level of measurement-target current flowing through the measurement-target object 18 in a state in which the current sensor 10 surrounds the measurement-target object 18.

It suffices that the sensor main body 12 is arranged so as to surround the measurement-target object 18 at the time of the measurement of the measurement-target current 16.

For example, a connecting portion that connects the ring-shaped sensor main body 12 so as to be separable in the circumferential direction is provided such that the sensor main body 12 can be separated at the connecting portion. By separating the sensor main body 12 at the connecting portion, an opening is formed in the ring-shaped sensor main body 12, and the measurement-target object 18 can be inserted into the insertion portion 14 from this opening. With such a configuration, at the time of measurement, the sensor main body 12 may be arranged so as to surround the measurement-target object 18.

An outer surface of the sensor main body 12 is formed by a cover 20 formed of a synthetic resin. The cover 20 has a circular ring shape. The cover 20 is provided with a first cover 22 and a second cover 24 that are divided into the thickness-wise direction of the sensor main body 12. The first cover 22 and the second cover 24 are each formed to have a U-shaped cross-section (see FIG. 3), and a space is formed between the first cover 22 and the second cover 24.

An outer circumference portion of the ring-shaped cover 20 is wound with a feedback winding 30 that is wound in the poloidal direction so as to extend along the toroidal direction. The feedback winding 30 is wound over the entire circumference of the cover 20.

For ease of understanding the configuration of the current sensor 10, FIG. 1 shows only a part of the feedback winding 30.

As shown in FIGS. 2 and 3, the first magnetic core 32 (see FIG. 3) and a flux gate sensor 34, which is arranged inside the first magnetic core 32, are provided between the first cover 22 and the second cover 24 of the cover 20.

With such a configuration, the feedback winding 30 wound around the cover 20 is wound on the outer side of the first magnetic core 32. In addition, the feedback winding 30 is wound around the first magnetic core 32 and a second magnetic core 35, which will be described below. The feedback winding 30 acts so as to cancel out a magnetic flux generated by the first magnetic core 32 with a magnetic flux generated by an input signal. A specific configuration for generating the magnetic flux for cancelling the magnetic flux generated by the first magnetic core 32 is defined by a relationship between the winding direction of the feedback winding 30 and a phase of the signal input to the feedback winding 30.

For ease of understanding the configuration of the inside of the current sensor 10, FIG. 2 shows a state in which the first magnetic core 32 is omitted.

The first magnetic core 32 is formed to have a circular ring shape. The first magnetic core 32 is arranged so as to surround the measurement-target object 18 at the time of the measurement.

As shown in FIG. 3, the first magnetic core 32 is provided with an inner first magnetic core 36 and an outer first magnetic core 38. The first magnetic cores 36 and 38 are each formed of a member having a U-shaped cross-section. As an example, the first magnetic cores 36 and 38 are each formed of a permalloy material (an iron-nickel soft magnetic material).

The inner first magnetic core 36 is smaller than the outer first magnetic core 38. The inner first magnetic core 36 has an opening portion 36a through which the flux gate sensor 34 can be inserted. The inner first magnetic core 36 accommodates the flux gate sensor 34.

The outer first magnetic core 38 has an opening portion 38a through which the inner first magnetic core 36 can be inserted. The outer first magnetic core 38 accommodates the inner first magnetic core 36, and the opening portion 36a of the inner first magnetic core 36 is located closer to a bottom portion of the outer first magnetic core 38.

The outer first magnetic core 38 closes the opening portion 36a of the inner first magnetic core 36 in a state in which the outer first magnetic core 38 is accommodating the inner first magnetic core 36. With such a configuration, the flux gate sensor 34 is accommodated in the first magnetic core 32.

The flux gate sensor 34 includes the second magnetic core 35 and an excitation detection winding 40 that is wound around the second magnetic core 35. With such a configuration, the second magnetic core 35 forming the flux gate sensor 34 is arranged next to the first magnetic core 32.

An excitation signal for exciting the second magnetic core 35 is input to the excitation detection winding 40. The excitation detection winding 40 detects the magnetic flux flowing through the second magnetic core 35 and output a detection signal indicating the measurement-target current 16. The second magnetic core 35 is formed to have a circular ring shape. At the time of the measurement, the second magnetic core 35 is arranged so as to surround the measurement-target object 18.

In this embodiment, a case in which the second magnetic core 35 is formed to have the circular ring shape has been described; however, the shape of the second magnetic core 35 is not limited thereto. For example, the second magnetic core 35 may be provided at a mid-part of the first magnetic core 32 (for example, see JP2012-83241A), or a plurality of second magnetic cores 35 may be provided so as to be separated in the circumferential direction of the first magnetic core 32 (for example, see JP2014-215103A).

The flux gate sensor 34 is provided with a first flux gate sensor 42 and a second flux gate sensor 44 that are arranged side by side so as to be aligned with each other.

The first flux gate sensor 42 includes a circular-ring-shaped third magnetic core 46 that forms the second magnetic core 35 and a first excitation detection winding 50 that is wound around the third magnetic core 46 to form the excitation detection winding 40. The first excitation detection winding 50 is wound in the poloidal direction so as to extend along the toroidal direction with respect to the ring-shaped third magnetic core 46.

A first excitation signal for exciting the third magnetic core 46 is input to the first excitation detection winding 50. The first excitation detection winding 50 detects the magnetic flux flowing through the third magnetic core 46 and outputs the first detection signal indicating the measurement-target current 16 (see FIG. 1).

The second flux gate sensor 44 includes a circular-ring-shaped fourth magnetic core 48 that forms the second magnetic core 35 and a second excitation detection winding 52 that is wound around the fourth magnetic core 48 to form the excitation detection winding 40. The second excitation detection winding 52 is wound in the poloidal direction so as to extend along the toroidal direction with respect to the ring-shaped fourth magnetic core 48.

A second excitation signal for exciting the fourth magnetic core 48 is input to the second excitation detection winding 52. The magnetic flux generated by the second excitation signal input to the second excitation detection winding 52 acts so as to cancel out the magnetic flux generated by the first excitation signal input to the first excitation detection winding 50. The second excitation detection winding 52 detects the magnetic flux flowing through the fourth magnetic core 48 and outputs a second detection signal indicating the measurement-target current 16.

The third magnetic core 46 and the fourth magnetic core 48 are arranged side by side. The third magnetic core 46 and the fourth magnetic core 48 are each formed of, as an example, the permalloy material (the iron-nickel soft magnetic material).

The third magnetic core 46 and the fourth magnetic core 48 may each be formed of a multi-layer substrate in which the permalloy material is inserted into inner layers. In this case, by forming a pattern wiring to have a helical shape extending along an outer circumferential surface of the multi-layer substrate, it is possible to from the excitation detection winding with the pattern wiring.

An auxiliary winding 54 is wound on the outer side of the flux gate sensor 34. The auxiliary winding 54 is wound around the third magnetic core 46, around which the first excitation detection winding 50 is wound, and the fourth magnetic core 48, around which the second excitation detection winding 52 is wound, together. The auxiliary winding 54 is wound in the poloidal direction so as to extend along the toroidal direction with respect to the ring-shaped flux gate sensor 34.

The auxiliary winding 54 is wound around the second magnetic core 35 having the third magnetic core 46 and the fourth magnetic core 48. The auxiliary winding 54 (see FIG. 4) detects the magnetic flux flowing through the second magnetic core 35 and outputs an auxiliary signal indicating the measurement-target current 16 (see FIG. 1).

The magnetic flux flowing through the second magnetic core 35 includes the magnetic flux that remains from the cancellation with the magnetic flux from the first excitation detection winding 50 and the magnetic flux the second excitation detection winding 52. The magnetic flux that remains from the cancellation becomes leakage flux. The auxiliary winding 54 outputs the auxiliary signal including the leakage flux leaked from the second magnetic core 35 of the flux gate sensor 34.

The auxiliary winding 54 is wound tightly such that no gap is formed between adjacent winding wires. The inner first magnetic core 36 and the outer first magnetic core 38 may be formed integrally.

Figure 4:
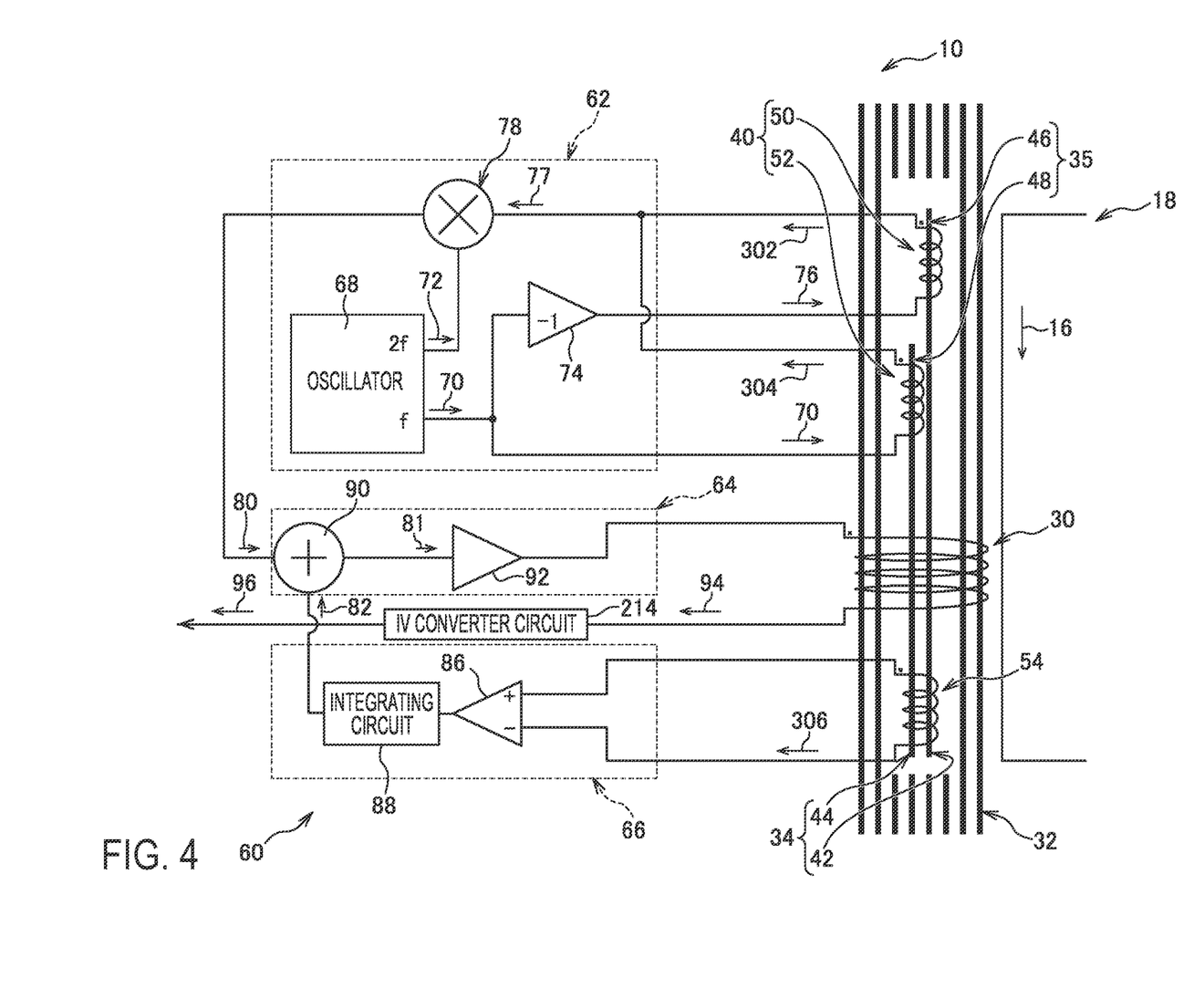
FIG. 4 is a circuit diagram of the current sensor according to the first embodiment.

FIG. 4 is a circuit diagram of the current sensor 10 according to the first embodiment and shows a sensor circuit 60.

The sensor circuit 60 is provided with a magnetic-flux detector 62, a feedback circuit 64, and a correction-signal generator 66.

The magnetic-flux detector 62 mainly detects the measurement-target current 16 with relatively low frequency of the measurement-target current 16 flowing through the measurement-target object 18. The measurement-target current 16 with relatively low frequency includes, as an example, the measurement-target current 16 with the frequency of at most 1 kHz to direct current (DC).

The magnetic-flux detector 62 is provided with an oscillator 68 that generates an AC signal. The oscillator 68 outputs an excitation signal 70 and a detection signal 72. Frequency $2f$ of the detection signal 72 is two times frequency f of the excitation signal 70. As an example, the frequency f of the excitation signal 70 is 10 KHz.

The oscillator 68 outputs the excitation signal 70 to one end of the second excitation detection winding 52. The excitation signal 70 input to the second excitation detection winding 52 indicates the second excitation signal. The second excitation detection winding 52 excites the fourth magnetic core 48 by the excitation signal 70.

In addition, the oscillator 68 outputs the excitation signal 70 to an inverting circuit 74. The inverting circuit 74 outputs an inversed-excitation signal 76 obtained by inverting the phase of the excitation signal 70 to the one end of the first excitation detection winding 50. The inversed-excitation signal 76 input to the first excitation detection winding 50 indicates the first excitation signal. The first excitation detection winding 50 excites the third magnetic core 46 by the inversed-excitation signal 76.

By doing so, the magnetic flux generated by the second excitation signal input to the second excitation detection winding 52 acts so as to cancel out the magnetic flux generated by the first excitation signal input to the first excitation detection winding 50, and so, it is possible to suppress the influences imparted to the detection of the measurement-target current 16.

As the measurement-target current 16 flows through the measurement-target object 18, the magnetic flux in each of the excitation detection windings 50 and 52 is changed by the magnetic field generated by the measurement-target current 16. As a result, a voltage waveform of the signal output from each of the excitation detection windings 50 and 52 is changed.

A signal indicating a difference between the voltage waveforms of the first excitation detection winding 50 and the second excitation detection winding 52 indicates an amplitude modulated signal 77 having frequency components corresponding to the level and the waveform of the measurement-target current 16.

The amplitude modulated signal 77 is detected from the magnetic flux flowing through the second magnetic core 35 and indicates the detection signal corresponding to the measurement-target current 16. The amplitude modulated signal 77 is formed of a first detection signal 302 detected by the first excitation detection winding 50 and a second detection signal 304 detected by the second excitation detection winding 52.

The amplitude modulated signal 77 is input to a detector circuit 78. The detector circuit 78 is synchronized with the excitation signal 70 and synchronously detects the amplitude modulated signal 77 with the detection signal 72 having the frequency $2f$, which is two times the frequency of the excitation signal 70.

With such a configuration, in the detector circuit 78, a feedback signal 80, which is proportional to the measurement-target current 16 with relatively low frequency, is obtained.

The correction-signal generator 66 generates a correction signal 82 in accordance with the magnetic flux that has leaked from the flux gate sensor 34 and that may influence the first magnetic core 32 or the measurement-target object 18. Specifically, the correction-signal generator 66 detects the leakage flux leaked from both of the magnetic cores 46 and 48 because the magnetic flux generated by the first excitation detection winding 50 of the flux gate sensor 34 and the magnetic flux generated by the second excitation detection winding 52 cannot be cancelled out with each other, and the correction-signal generator 66 generates the correction signal 82 indicating the leakage flux.

The correction-signal generator 66 is provided with an acquisition circuit 86 that acquires and amplifies an auxiliary signal 306 output from the auxiliary winding 54. The acquisition circuit 86 outputs thus-acquired and amplified auxiliary signal 306 to an integrating circuit 88. The integrating circuit 88 generates and outputs the correction signal 82 that is a signal obtained by integrating the auxiliary signal 306.

The feedback circuit 64 modifies the feedback signal 80 generated from the amplitude modulated signal 77, which is the detection signal, in the magnetic-flux detector 62 and feeds back a modified feedback signal 81 after the modification to the feedback winding 30.

The feedback circuit 64 is provided with a modifying circuit 90 that modifies the feedback signal 80 from the detector circuit 78 of the magnetic-flux detector 62. As an example, the modifying circuit 90 is formed of an adjusting circuit, and the adjusting circuit adjusts the feedback signal 80 on the basis of the correction signal 82. The modified feedback signal 81 that has been modified at the modifying circuit 90 is amplified by an amplifying circuit 92 and is input to one end of the feedback winding 30.

The feedback winding 30 mainly detects the measurement-target current 16 with relatively high frequency flowing through the measurement-target object 18. An example of the measurement-target current 16 with relatively high frequency includes the measurement-target current 16 with the frequency of at least 1 kHz.

The modified feedback signal 81, which is proportional to the measurement-target current 16 with relatively low frequency described above, is input to the one end of the feedback winding 30. With such a configuration, the magnetic flux with relatively low frequency flowing through the first magnetic core 32 is cancelled out (zero flux operation). In addition, the feedback winding 30 detects a signal, which is proportional to the measurement-target current 16 with relatively high frequency.

Thus, the other end of the feedback winding 30 outputs a proportional signal 94, which is proportional to the measurement-target current 16 with low to high frequencies. In addition, the current sensor 10 outputs an output signal 96 that is obtained by converting the proportional signal 94, which has been output as a current value from the feedback winding 30, to a voltage value by an IV converter circuit 214.

(Operations and Effects)

Next, operational advantages achieved by this embodiment will be described.

The current sensor 10 in this embodiment is provided with the first magnetic core 32 that surrounds the measurement-target object 18 through which the measurement-target current 16 flows and the second magnetic core 35 that is arranged next to the first magnetic core 32. The current sensor 10 is provided with the excitation detection winding 40 wound around the second magnetic core 35, the excitation detection winding 40 being configured such that the excitation signal 70 for exciting the second magnetic core 35 is input, and the excitation detection winding 40 being configured to detect the magnetic flux flowing through the second magnetic core 35 and to output the detection signal (the amplitude modulated signal 77) indicating the measurement-target current 16. The current sensor 10 is provided with the auxiliary winding 54 wound around the second magnetic core 35, the auxiliary winding 54 being configured to detect the magnetic flux flowing through the second magnetic core 35 and to output the auxiliary signal 306 indicating the measurement-target current 16. The current sensor 10 is provided with the feedback winding 30 wound around the first magnetic core 32 and the second magnetic core 35, the feedback winding 30 being configured such that the signal generated from the detection signal (the amplitude modulated signal 77) is input, and the feedback winding 30 being wound so as to cancel out the magnetic flux of the first magnetic core 32 and the second magnetic core 35. The current sensor 10 is provided with the circuit (the sensor circuit 60) configured to output the output signal 96 indicating the level of the measurement-target current 16 by modifying the signal (the proportional signal 94) output from the feedback winding 30 based on the correction signal 82 generated from the auxiliary signal 306, the signal (the proportional signal 94) from the feedback winding 30 being output in accordance with the measurement-target current 16.

With this configuration, the feedback winding 30 that detects the proportional signal 94 in accordance with the measurement-target current 16 is wound around the first magnetic core 32 and the second magnetic core 35. Specifically, the feedback winding 30 is wound around the outside the first magnetic core 32 that is arranged on the outside of the second magnetic core 35.

The auxiliary winding 54 that detects the auxiliary signal 306 for modifying the proportional signal 94 is wound around the second magnetic core 35. Specifically, the auxiliary winding 54 is wound around the second magnetic core 35 that is arranged inside the first magnetic core 32.

Thus, compared with a case in which the feedback winding 30 and the auxiliary winding 54 are wound around the same core, it is possible to reduce a capacitive coupling that is generated between the feedback winding 30 and the auxiliary winding 54 in a high frequency band. With such a configuration, the limitation on the frequency band is suppressed.

Therefore, it is possible to provide the current sensor with a wide frequency band.

In addition, in the current sensor 10 in this embodiment, the second magnetic core 35 is formed of the third magnetic core 46 and the fourth magnetic core 48, the third magnetic core 46 and the fourth magnetic core 48 being arranged side by side. The excitation detection winding 40 is provided with the first excitation detection winding 50. The first excitation detection winding 50 is wound around the third magnetic core 46, the first excitation detection winding 50 being configured such that the first excitation signal (the inversed-excitation signal 76) for exciting the third magnetic core 46 is input, the first excitation detection winding 50 being configured to detect the exciting magnetic flux flowing through the third magnetic core 46 and to output the first detection signal 302 indicating the measurement-target current 16. In addition, the excitation detection winding 40 is provided with the second excitation detection winding 52. The second excitation detection winding 52 is wound around the fourth magnetic core 48, the second excitation detection winding 52 being configured such that the second excitation signal (the excitation signal 70) for exciting the fourth magnetic core 48 is input and so as to cancel out the magnetic flux generated at the first excitation detection winding 50. The second excitation detection winding 52 is configured to detect the magnetic flux flowing through the fourth magnetic core 48 and to output the second detection signal 304 indicating the measurement-target current 16. The auxiliary winding 54 is formed of the winding wound around the third magnetic core 46 and the fourth magnetic core 48 together, the third magnetic core 46 being wound with the first excitation detection winding 50, and the fourth magnetic core 48 being wound with the second excitation detection winding 52. In the feedback winding 30, the signal (the modified feedback signal 81) generated from the first detection signal 302 and the second detection signal 304 is input.

In other words, in a case in which there is a difference in the exciting magnetic fluxes generated at the respective magnetic cores 46 and 48 due to differences in properties of the third magnetic core 46 and the fourth magnetic core 48, there may be a case in which the exciting magnetic fluxes generated at both of the magnetic cores 46 and 48 cannot be cancelled out. In this case, the magnetic fluxes that cannot be cancelled out leak to the first magnetic core 32, and the feedback winding 30 wound around the outside of the first magnetic core 32 or the measurement-target object 18 may be affected.

Thus, in the current sensor 10, the auxiliary winding 54 that outputs the auxiliary signal 306 for generating the correction signal 82 is wound around the third magnetic core 46 and the fourth magnetic core 48 together, the third magnetic core 46 being wound with the first excitation detection winding 50, and the fourth magnetic core 48 being wound with the second excitation detection winding 52.

Thus, by modifying the output from the current sensor 10 by the output from the auxiliary winding 54, it is possible to modify the influence imparted to the current sensor 10 by the magnetic flux that remains from the cancellation with the first excitation detection winding 50 and the second excitation detection winding 52 forming a pair.

Therefore, it is possible to perform the measurement with a high accuracy.

In addition, in the current sensor 10 in this embodiment, the circuit (the sensor circuit 60) is configured to modify, based on the correction signal 82, the output signal 96 by adjusting the signal (the modified feedback signal 81) input to the feedback winding 30.

As described above, by performing the feedback by inputting the output from the auxiliary winding 54 before the feedback winding 30, it is possible to correct the current value and to increase a flatness of the frequency range.

In addition, the auxiliary winding 54 is arranged on the inner side of the first magnetic core 32 where a magnetic permeability is high in the main detection band for the flux gate sensor 34. Thus, in the main detection band for the flux gate sensor 34 where the frequency is relatively low, the first magnetic core 32 acts as a magnetic shielding, and the detection of the measurement-target current 16 by the auxiliary winding 54 is suppressed.

Furthermore, by suitably adjusting a cutoff frequency by the integrating circuit 88, in the relatively high frequency band that is the band in which the feedback winding 30 acts as the current transformer, for example, in the band of at least several hundreds kHz, the detection of the measurement-target current 16 by the auxiliary winding 54 is suppressed.

Thus, it is possible to achieve negative feedback by the auxiliary winding 54 only at the main detection band of the flux gate sensor 34 and a band of the boundary of the band in which the feedback winding 30 acts as the current transformer. Therefore, it is possible to increase the flatness of the frequency range while reducing an excitation noise caused by the leakage flux at the band of the boundary.

Second Embodiment

Next, a current sensor 210 according to a second embodiment will be described with reference to the drawings.

Figure 5:
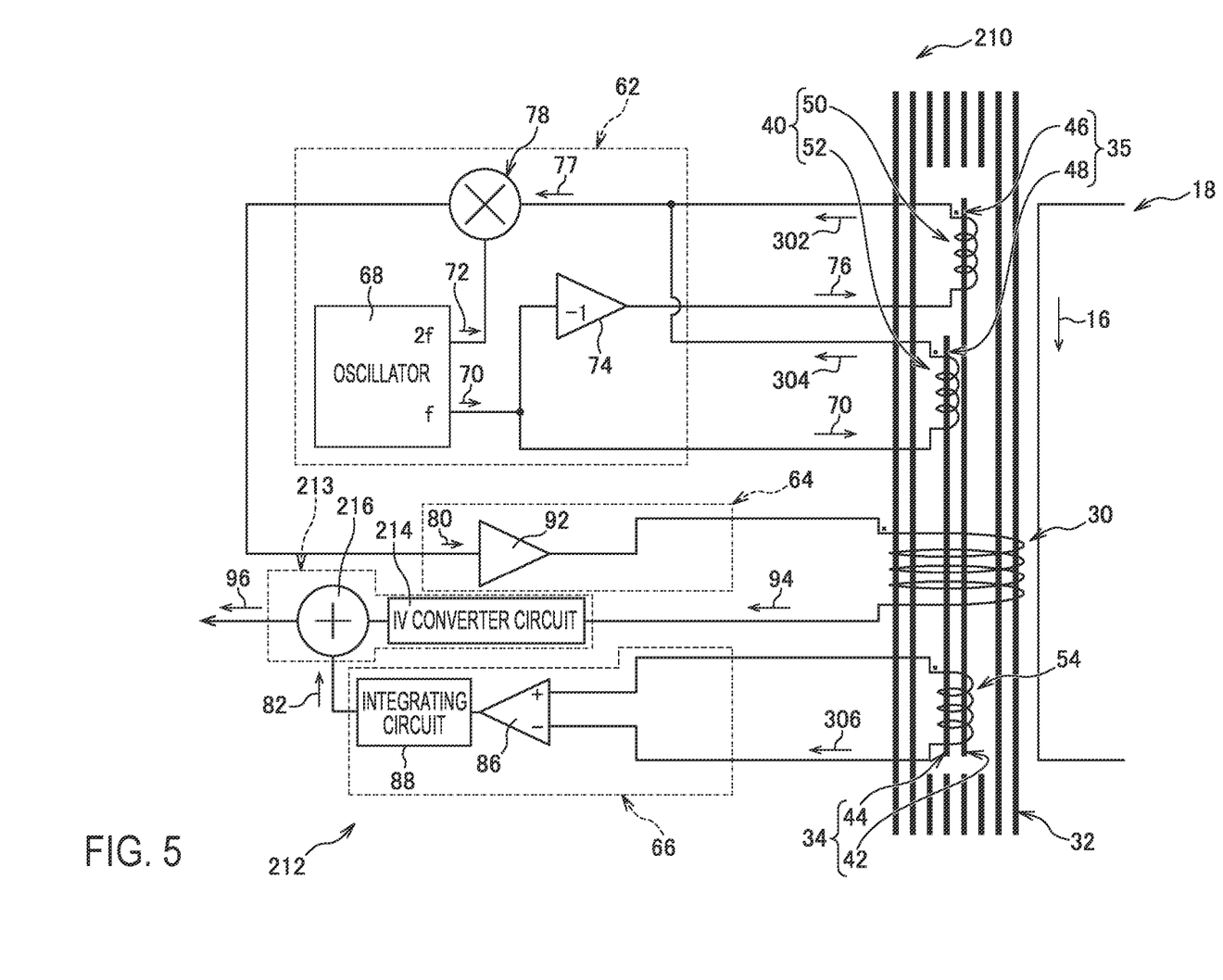
FIG. 5 is a circuit diagram of the current sensor according to a second embodiment.

FIG. 5 is a circuit diagram of the current sensor 210 according to the second embodiment. When compared with the first embodiment, in the current sensor 210 according to the second embodiment, the method for modifying the proportional signal 94 detected by the feedback winding 30 on the basis of the correction signal 82 is different. In this embodiment, components that are the same as or similar to those in the first embodiment will be assigned the same reference numerals, and a description thereof shall be omitted. Description will only be given of components that are different from those in the first embodiment.

A sensor circuit 212 of the current sensor 210 according to the second embodiment is provided with: the magnetic-flux detector 62; the feedback circuit 64; the correction-signal generator 66; and a modifying circuit 213.

The feedback circuit 64 amplifies the feedback signal 80, which is acquired at the magnetic-flux detector 62, by the amplifying circuit 92 and outputs it to the one end of the feedback winding 30.

The modifying circuit 213 is provided with the IV converter circuit 214 and a correction circuit 216. The IV converter circuit 214 converts the proportional signal 94, which is output from the feedback winding 30 as the current value, to the voltage value and outputs it to the correction circuit 216.

The correction circuit 216 corrects the proportional signal 94 from the IV converter circuit 214 on the basis of the correction signal 82 from the correction-signal generator 66.

With such a configuration, the sensor circuit 212 outputs the output signal 96 obtained by subtracting, from the proportional signal 94 containing an error signal generated from the leakage flux from the flux gate sensor 34, the error signal.

(Operations and Effects)

Next, operational advantages achieved by this embodiment will be described.

Also in this embodiment, for the parts that are similar to or the same as those of the first embodiment, similar operational advantages can be achieved.

In addition, in the current sensor in this embodiment, the circuit (the sensor circuit 212) is configured to modify, based on the correction signal 82, the output signal 96 by correcting the signal (the proportional signal 94) output from the feedback winding 30.

In this configuration, it is possible to correct the current value by inputting the output from the auxiliary winding 54 after the feedback winding 30.

Specifically, the proportional signal 94 detected by the feedback winding 30 is corrected on the basis of the correction signal 82 acquired from the auxiliary winding 54. Thus, compared with a case in which the output signal 96 is modified by adjusting the feedback signal 80 input to the feedback winding 30, it is possible to achieve simplification of the control for adjusting the output signal 96.

In both embodiments, the excitation detection winding 40, to which the excitation signal 70 for exciting the second magnetic core 35 is input and which detects the magnetic flux flowing through the second magnetic core 35 and outputs the detection signal (the amplitude modulated signal 77) indicating the measurement-target current 16, has been described as an example. However, this embodiment is not limited to this structure.

For example, the excitation detection winding 40 may be formed of the excitation winding to which the excitation signal 70 is input and the detection winding that outputs the detection signal (the amplitude modulated signal 77).

In addition, in the both embodiments, a case in which the first excitation detection winding 50 inputs the first excitation signal (the inversed-excitation signal 76) for exciting the third magnetic core 46, and the first excitation detection winding 50 detects the magnetic flux flowing through the third magnetic core 46 and outputs the first detection signal 302 has been described as an example. In addition, a case in which the second excitation detection winding 52 is configured to input the second excitation signal (the excitation signal 70) for exciting the fourth magnetic core 48 and to cancel out the magnetic flux generated at the first excitation detection winding 50, and the second excitation detection winding 52 detects the magnetic flux flowing through the fourth magnetic core 48 and outputs a second detection signal 204 has been described. However, this embodiment is not limited to this configuration.

For example, the first excitation detection winding 50 is formed of the first excitation winding to which the first excitation signal (the inversed-excitation signal 76) is input and the first detection winding that outputs the first detection signal 302. In addition, the second excitation detection winding 52 may be formed of the second excitation winding to which the second excitation signal (the excitation signal 70) is input and the second detection winding that outputs the second detection signal 204.

Third Embodiment

A current sensor 310 according to a third embodiment will be described with reference to the drawings.

Figure 6:
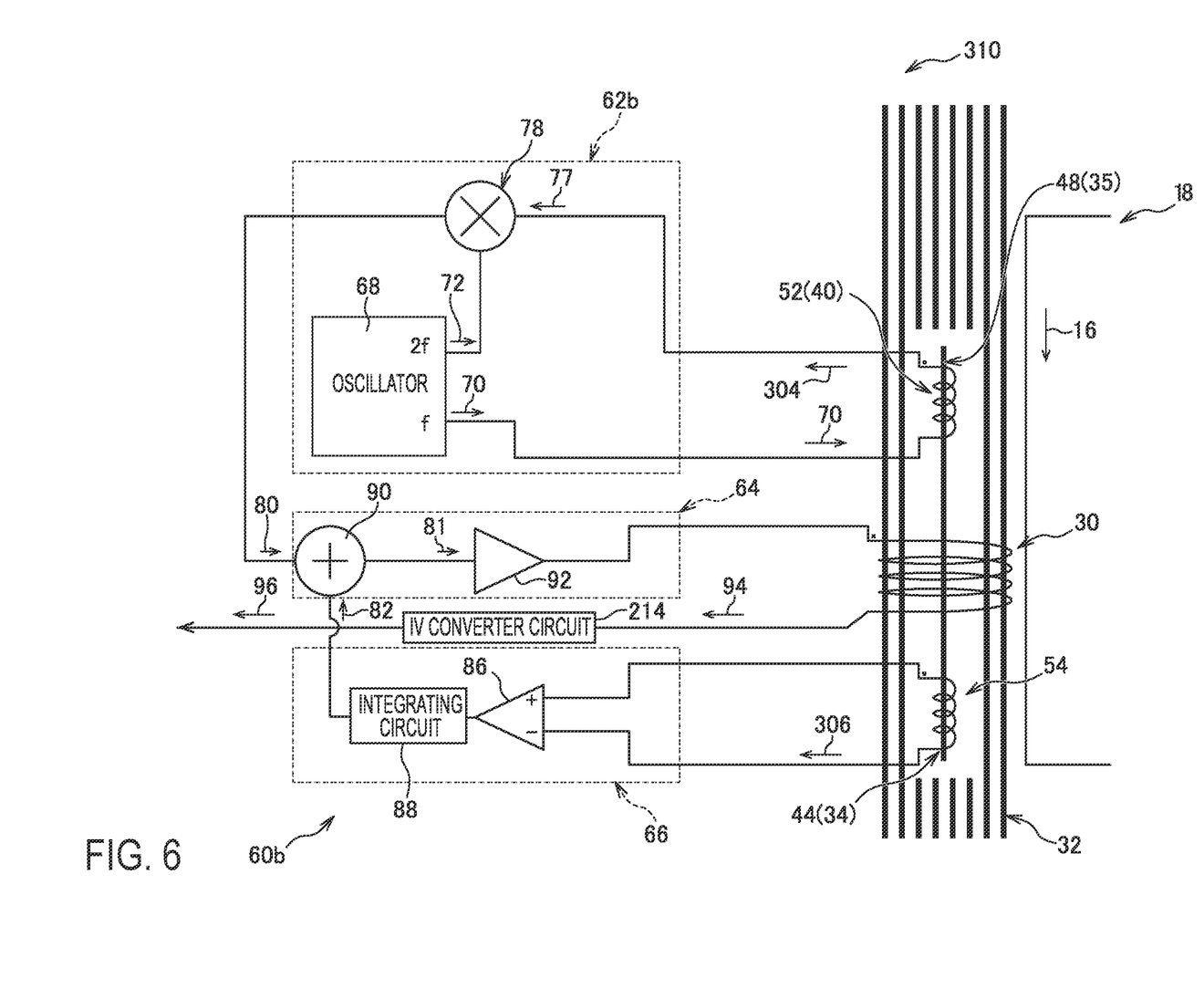
FIG. 6 is a circuit diagram of the current sensor according to a third embodiment.

FIG. 6 is a circuit diagram of the current sensor 310 according to the third embodiment. The current sensor 310 according to the third embodiment is a modification of the first embodiment. In the current sensor 310, the flux gate sensor 34 and a magnetic-flux detector 62b in a sensor circuit 60b are different compared with the first embodiment.

Specifically, the flux gate sensor 34 is configured only of the second flux gate sensor 44. With such a configuration, the excitation detection winding 40 that is wound around the second magnetic core 35 of the flux gate sensor 34 is configured only of the second excitation detection winding 52.

In the magnetic-flux detector 62b in the third embodiment, the inverting circuit 74 in the first embodiment (see FIG. 4) is omitted, and the first excitation detection winding 50 to which the inverting circuit 74 is connected in the first embodiment is omitted.

(Operations and Effects)

Also in the current sensor 310 according to this embodiment, the auxiliary winding 54 is wound around the second magnetic core 35 that is arranged inside the first magnetic core 32, and therefore, it is possible to achieve the operational advantages equivalent to those of the first embodiment.

Fourth Embodiment

The current sensor 310 according to a fourth embodiment will be described with reference to the drawings.

Figure 7:
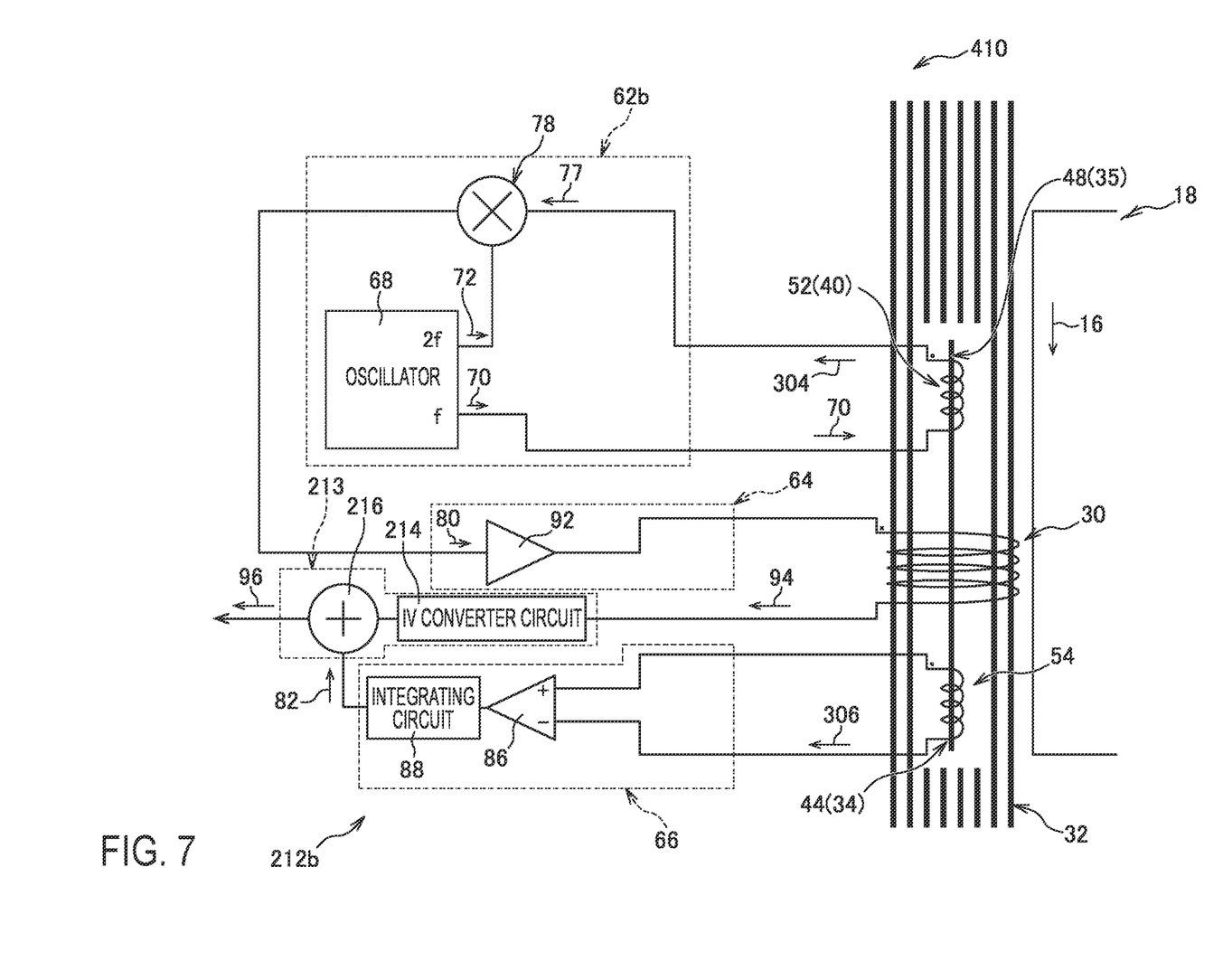
FIG. 7 is a circuit diagram of the current sensor according to a fourth embodiment.

FIG. 7 is a circuit diagram of a current sensor 410 according to the fourth embodiment. The current sensor 410 according to the fourth embodiment is a modification of the second embodiment. In the current sensor 410, the flux gate sensor 34 and the magnetic-flux detector 62b in a sensor circuit 212b are different compared with the second embodiment.

Specifically, similarly to the third embodiment, the flux gate sensor 34 is configured only of the second flux gate sensor 44. With such a configuration, the excitation detection winding 40 that is wound around the second magnetic core 35 of the flux gate sensor 34 is configured only of the second excitation detection winding 52.

In the magnetic-flux detector 62b in the fourth embodiment, the inverting circuit 74 in the second embodiment is omitted, and the first excitation detection winding 50 to which the inverting circuit 74 is connected in the second embodiment is omitted.

(Operations and Effects)

Also in the current sensor 410 according to this embodiment, the auxiliary winding 54 is wound around the second magnetic core 35 that is arranged inside the first magnetic core 32, and therefore, it is possible to achieve the operational advantages equivalent to the second embodiment.

Although the embodiments of the present invention have been described in the above, the above-mentioned embodiments merely illustrate a part of application examples of the present invention, and the technical scope of the present invention is not intended to be limited to the specific configurations in the above-mentioned embodiments.

In the above-described embodiments, the second magnetic core 35 is arranged inside the first magnetic core 32. Although the shielding effect is lowered, the first magnetic core 32 and the second magnetic core 35 may be arranged side by side.

This application claims priority based on Japanese Patent Application No. 2021-097432 filed with the Japan Patent Office on Jun. 10, 2021, the entire contents of which are incorporated into this specification by reference.

REFERENCE SIGNS LIST 10, 210, 310, 410 current sensor
16 measurement-target current
18 measurement-target object
30 feedback winding
32 first magnetic core
34 flux gate sensor
35 second magnetic core
40 excitation detection winding
42 first flux gate sensor
44 second flux gate sensor
46 third magnetic core
48 fourth magnetic core
50 first excitation detection winding
52 second excitation detection winding
54 auxiliary winding
60, 60b sensor circuit
70 excitation signal (second excitation signal)
76 inversed-excitation signal (first excitation signal)
80 feedback signal
81 modified feedback signal
82 correction signal
94 proportional signal
96 output signal
214 IV converter circuit

What is claimed is:
1. A current sensor comprising:
a first magnetic core configured to surround a measurement-target object through which a measurement-target current flows;
a second magnetic core separated from the first magnetic core and arranged next to the first magnetic core;
an excitation detection winding wound around the second magnetic core, the excitation detection winding being configured such that an excitation signal for exciting the second magnetic core is input to the excitation detection winding, and the excitation detection winding being configured to detect magnetic flux flowing through the second magnetic core and to output a detection signal indicating the measurement-target current;

an auxiliary winding wound around the second magnetic core, the auxiliary winding being configured to detect the magnetic flux flowing through the second magnetic core and to output an auxiliary signal indicating the measurement-target current;

a feedback winding wound around the first magnetic core and the second magnetic core, the feedback winding being configured to have an input signal generated from the detection signal, and the feedback winding being wound so as to cancel out magnetic flux of the first magnetic core; and a circuit configured to output an output signal indicating a level of the measurement-target current by modifying a signal output from the feedback winding based on a correction signal generated from the auxiliary signal, the signal output from the feedback winding being output in accordance with the measurement-target current.

2. The current sensor according to claim 1, wherein the second magnetic core is formed of a third magnetic core and a fourth magnetic core, the third magnetic core and the fourth magnetic core being arranged side by side, the excitation detection winding is formed of:
  a first excitation detection winding wound around the third magnetic core, the first excitation detection winding being configured such that a first excitation signal for exciting the third magnetic core is input to the first excitation detection winding, and the first excitation detection winding being configured to detect magnetic flux flowing through the third magnetic core and to output a first detection signal indicating the measurement-target current; and
  a second excitation detection winding wound around the fourth magnetic core, the second excitation detection winding being configured such that a second excitation signal for exciting the fourth magnetic core is input to the second excitation detection winding and so as to cancel out magnetic flux generated at the first excitation detection winding, and the second excitation detection winding being configured to detect magnetic flux flowing through the fourth magnetic core and to output a second detection signal indicating the measurement-target current, the auxiliary winding is formed of a winding wound around the third magnetic core and the fourth magnetic core together, the third magnetic core being wound with the first excitation detection winding, and the fourth magnetic core being wound with the second excitation detection winding, and the feedback winding is configured such that a signal generated from the first detection signal and the second detection signal is input to the feedback winding.

3. The current sensor according to claim 1, wherein the excitation detection winding is formed to include an excitation winding to which the excitation signal is input and a detection winding configured to output the detection signal.

4. The current sensor according to claim 2, wherein the first excitation detection winding is formed to include a first excitation winding to which the first excitation signal is input and a first detection winding configured to output the first detection signal, and the second excitation detection winding is formed to include a second excitation winding to which the second excitation signal is input and a second detection winding configured to output the second detection signal.

5. The current sensor according to claim 1, wherein the circuit is configured to modify, based on the correction signal, the output signal by adjusting the input signal input to the feedback winding.

6. The current sensor according to claim 1, wherein the circuit is configured to modify, based on the correction signal, the output signal by correcting the signal output from the feedback winding.

7. The current sensor according to claim 1, wherein the second magnetic core is free of contact with the first magnetic core.

8. The current sensor according to claim 1, wherein the second magnetic core is isolated from the first magnetic core.

9. A current sensor comprising:
  a first magnetic core configured to surround a measurement-target object through which a measurement-target current flows;
  a second magnetic core arranged next to the first magnetic core;
  an excitation detection winding wound around the second magnetic core, the excitation detection winding being configured such that an excitation signal for exciting the second magnetic core is input to the excitation detection winding, and the excitation detection winding being configured to detect magnetic flux flowing through the second magnetic core and to output a detection signal indicating the measurement-target current;
  an auxiliary winding wound around the second magnetic core, the auxiliary winding being configured to detect the magnetic flux flowing through the second magnetic core and to output an auxiliary signal indicating the measurement-target current;
  a feedback winding wound around the first magnetic core and the second magnetic core, the feedback winding being configured to have an input signal generated from the detection signal, and the feedback winding being wound so as to cancel out magnetic flux of the first magnetic core; and
  a circuit configured to output an output signal indicating a level of the measurement-target current by modifying a signal output from the feedback winding based on a correction signal generated from the auxiliary signal, the signal output from the feedback winding being output in accordance with the measurement-target current, wherein the second magnetic core is formed of a third magnetic core and a fourth magnetic core, the third magnetic core and the fourth magnetic core being arranged side by side, the excitation detection winding is formed of:
  a first excitation detection winding wound around the third magnetic core, the first excitation detection winding being configured such that a first excitation signal for exciting the third magnetic core is input to the first excitation detection winding, and the first excitation detection winding being configured to detect magnetic flux flowing through the third magnetic core and to output a first detection signal indicating the measurement-target current; and a second excitation detection winding wound around the fourth magnetic core, the second excitation detection winding being configured such that a second excitation signal for exciting the fourth magnetic core is input to the second excitation detection winding and so as to cancel out magnetic flux generated at the first excitation detection winding, and the second excitation detection winding being configured to detect magnetic flux flowing through the fourth magnetic core and to output a second detection signal indicating the measurement-target current, the auxiliary winding is formed of a winding wound around the third magnetic core and the fourth magnetic core together, the third magnetic core being wound with the first excitation detection winding, and the fourth magnetic core being wound with the second excitation detection winding, and the feedback winding is configured such that a signal generated from the first detection signal and the second detection signal is input to the feedback winding.

\* \* \* \* \*